United States Patent
Sekiya et al.

(10) Patent No.: US 9,123,797 B2
(45) Date of Patent: Sep. 1, 2015

(54) RESIN POWDER WAFER PROCESSING UTILIZING A FRAME WITH A PLURALITY OF PARTITIONS

(71) Applicant: DISCO CORPORATION, Tokyo (JP)

(72) Inventors: Kazuma Sekiya, Tokyo (JP); Tomotaka Tabuchi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/542,905

(22) Filed: Nov. 17, 2014

(65) Prior Publication Data

US 2015/0140784 A1    May 21, 2015

(30) Foreign Application Priority Data

Nov. 21, 2013    (JP) .................................. 2013-240945

(51) Int. Cl.

| H01L 21/00 | (2006.01) |
|---|---|
| H01L 23/24 | (2006.01) |
| H01L 21/78 | (2006.01) |
| H01L 21/033 | (2006.01) |
| H01L 21/311 | (2006.01) |
| H01L 21/3065 | (2006.01) |
| H01L 21/683 | (2006.01) |
| H01L 23/544 | (2006.01) |
| H01L 21/304 | (2006.01) |

(52) U.S. Cl.
CPC ............ *H01L 21/78* (2013.01); *H01L 21/0337* (2013.01); *H01L 21/3065* (2013.01); *H01L 21/31116* (2013.01); *H01L 21/6835* (2013.01); *H01L 23/544* (2013.01); *H01L 21/3043* (2013.01); *H01L 21/31138* (2013.01)

(58) Field of Classification Search
CPC ..................... H01L 21/31116; H01L 21/3043; H01L 21/78; H01L 23/544; H01L 21/31138
See application file for complete search history.

(56) References Cited

U.S. PATENT DOCUMENTS

| 7,541,658 | B2 * | 6/2009 | Kinsman ........................ 257/433 |
| 2004/0038442 | A1 * | 2/2004 | Kinsman .......................... 438/64 |
| 2006/0035415 | A1 * | 2/2006 | Wood et al. .................... 438/125 |
| 2009/0298300 | A1 * | 12/2009 | Ranish et al. .................. 438/795 |
| 2012/0235282 | A1 * | 9/2012 | Tomono et al. ................ 257/618 |

FOREIGN PATENT DOCUMENTS

JP    2006-120834    5/2006

* cited by examiner

*Primary Examiner* — Alonzo Chambliss

(74) *Attorney, Agent, or Firm* — Greer Burns and Crain, LTD.

(57) ABSTRACT

A wafer processing method for dividing a wafer into individual devices along a plurality of crossing division lines, including a frame preparing step of preparing a frame having a plurality of crossing partitions corresponding to the division lines of the wafer, a resin covering step of spreading a resin powder on the wafer and positioning the partitions of the frame in alignment with the division lines, thereby covering with the resin powder the regions of the wafer other than the regions corresponding to the division lines, a masking step of melting and curing the resin powder supplied to the wafer processed by the resin covering step and next removing the frame, thereby masking the regions other than the regions corresponding to the division lines, and an etching step of plasma-etching the wafer processed by the masking step to thereby divide the wafer into the individual devices along the division lines.

3 Claims, 8 Drawing Sheets

RESIN POWDER WAFER PROCESSING UTILIZING A FRAME WITH A PLURALITY OF PARTITIONS

BACKGROUND OF THE INVENTION

1. Field of the Invention

The present invention relates to a wafer processing method for dividing a wafer into individual devices along a plurality of crossing division lines formed on the front side of the wafer, the individual devices being formed in a plurality of separate regions defined by the division lines.

2. Description of the Related Art

In a semiconductor device fabrication process, a plurality of crossing division lines are formed on the front side of a substantially disk-shaped semiconductor wafer to thereby define a plurality of separate regions where a plurality of devices such as ICs and LSIs are formed. The semiconductor wafer is cut along the division lines to thereby divide the regions where the devices are formed from each other, thus obtaining the individual devices.

Cutting of the semiconductor wafer along the division lines is usually performed by using a cutting apparatus called a dicing saw. This cutting apparatus includes a chuck table for holding a workpiece, cutting means having a cutting blade for cutting the workpiece held on the chuck table, and feeding means for relatively moving the chuck table and the cutting means. By feeding the chuck table holding the workpiece as rotating the cutting blade, the wafer is cut along each division line.

However, when the wafer is cut by the cutting blade of the cutting apparatus mentioned above, chipping is apt to occur in the periphery of each device chip divided from the wafer, causing a reduction in die strength of each device chip. To solve such a problem, there has been proposed a method including the steps of forming a resist film on the back side of a wafer, exposing to light the region of the resist film corresponding to each division line of the wafer, thereby removing this region by development, and then etching the wafer from the resist film side along the division lines as by plasma etching, thereby dividing the wafer along the division lines (see Japanese Patent Laid-Open No. 2006-120834, for example).

SUMMARY OF THE INVENTION

However, the method of dividing the wafer along the division lines by using plasma etching requires an exposure apparatus and a developing apparatus for exposing to light the region of the resist film formed on the back side of the wafer corresponding to each division line of the wafer, thereby removing this region by development. Accordingly, there arises a problem such that an equipment cost is increased.

It is therefore an object of the present invention to provide a wafer processing method which can divide a wafer along the division lines of the wafer by using plasma etching without the need for an exposure apparatus and a developing apparatus.

In accordance with an aspect of the present invention, there is provided a wafer processing method for dividing a wafer into individual devices along a plurality of crossing division lines formed on the front side of the wafer, the individual devices being formed in a plurality of separate regions defined by the division lines, the wafer processing method including a frame preparing step of preparing a frame having a plurality of crossing partitions corresponding to the division lines of the wafer; a resin covering step of spreading a resin powder on the front side or back side of the wafer and positioning the partitions of the frame in alignment with the division lines of the wafer, thereby covering with the resin powder the regions on the front side or back side of the wafer other than the regions corresponding to the division lines; a masking step of melting and curing the resin powder supplied to the front side or back side of the wafer processed by the resin covering step and next removing the frame, thereby masking the regions other than the regions corresponding to the division lines; and an etching step of plasma-etching the wafer processed by the masking step to thereby divide the wafer into the individual devices along the division lines.

Preferably, the resin covering step includes the step of applying ultrasonic vibration to the frame in the condition where the partitions of the frame are positioned in alignment with the division lines, thereby removing the resin powder from the regions corresponding to the division lines.

Preferably, the resin covering step includes the step of spreading the resin powder in the condition where the partitions of the frame are positioned in alignment with the division lines.

As described above, the wafer processing method according to the present invention includes the frame preparing step of preparing the frame having the plural crossing partitions corresponding to the division lines formed on the wafer, the resin covering step of spreading the resin powder on the front side or back side of the wafer and positioning the partitions of the frame in alignment with the division lines of the wafer, thereby covering with the resin powder the regions on the front side or back side of the wafer other than the regions corresponding to the division lines, the masking step of melting and curing the resin powder supplied to the front side or back side of the wafer processed by the resin covering step and next removing the frame, thereby masking the regions other than the regions corresponding to the division lines, and the etching step of plasma-etching the wafer processed by the masking step to thereby divide the wafer into the individual devices along the division lines. Accordingly, no exposure apparatus and no developing apparatus are required to thereby suppress an equipment cost.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
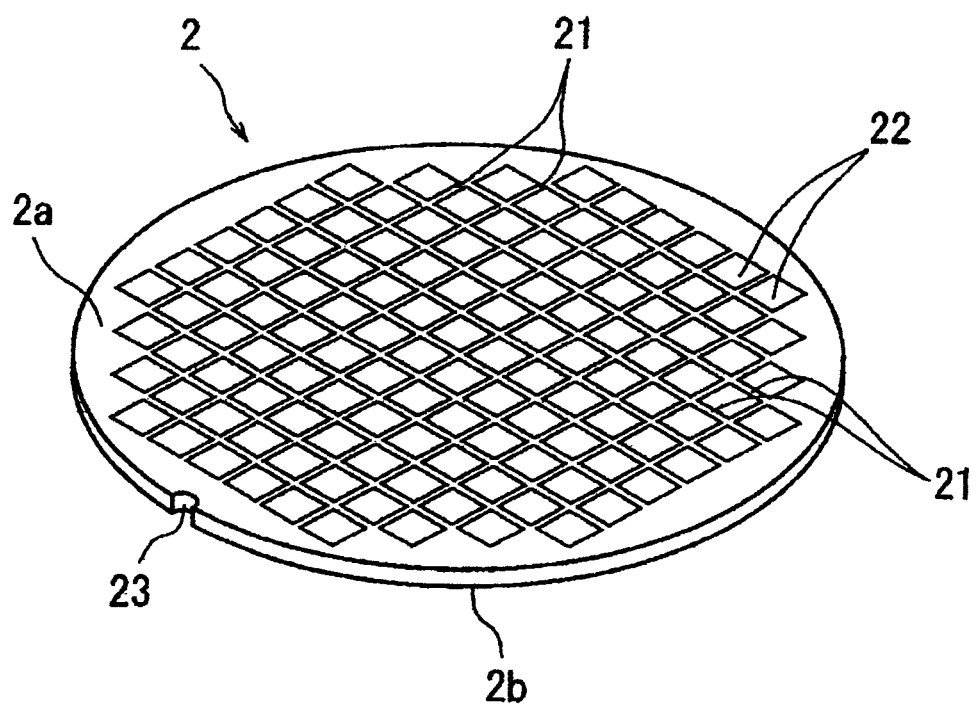
FIG. 1 is a perspective view of a semiconductor wafer to be divided by the wafer processing method according to the present invention.

A preferred embodiment of the wafer processing method according to the present invention will now be described in detail with reference to the attached drawings. FIG. 1 is a perspective view of a semiconductor wafer 2 as a workpiece to be processed in accordance with the present invention. The semiconductor wafer 2 shown in FIG. 1 is a silicon wafer having a thickness of 100 µm, for example. The semiconductor wafer 2 has a front side 2a and a back side 2b. A plurality of crossing division lines 21 are formed on the front side 2a of the semiconductor wafer 2 to thereby define a plurality of separate regions where a plurality of devices 22 such as ICs and LSIs are formed. Further, a notch 23 for indicating a crystal orientation is formed on the outer circumference of the semiconductor wafer 2 so as to extend from the front side 2a to the back side 2b.

Figure 2A:
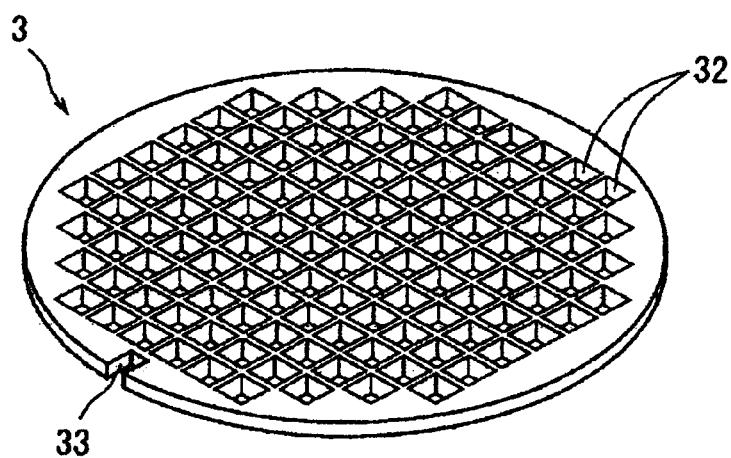
FIG. 2A is a perspective view of a frame having a plurality of crossing partitions corresponding to the division lines formed on the semiconductor wafer shown in FIG. 1.
Figure 2B:
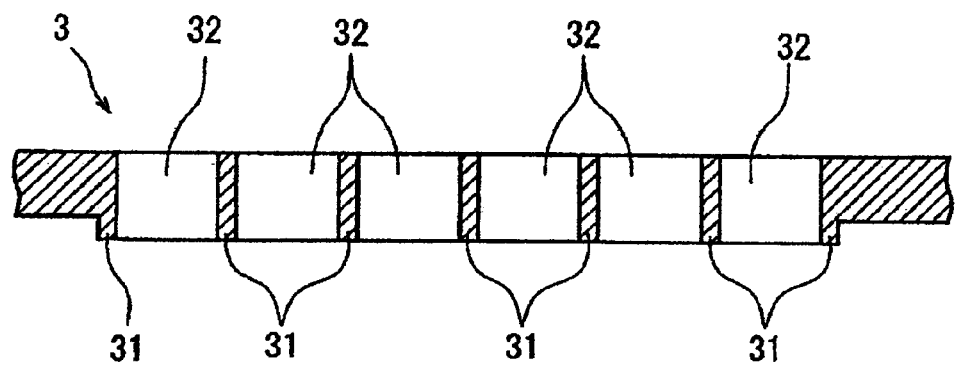
FIG. 2B is an enlarged sectional view of an essential part of the frame shown in FIG. 2A.

There will now be described a wafer processing method for dividing the semiconductor wafer 2 into the individual devices 22 along the division lines 21. First, a frame preparing step is performed to prepare a frame having a plurality of crossing partitions corresponding to the division lines 21 formed on the semiconductor wafer 2. This frame will now be described with reference to FIGS. 2A and 2B. In FIGS. 2A and 2B, reference numeral 3 denotes this frame, which includes a plurality of crossing partitions 31 corresponding to the division lines 21. Accordingly, a plurality of hollow regions 32 are defined by the plural partitions 31. The frame 3 is formed of metal or silicon. The outer circumference of the frame 3 is formed with a cutout 33 as an alignment mark corresponding to the notch 23 formed on the outer circumference of the semiconductor wafer 2. The partitions 31 of the frame 3 are preliminarily treated with a release agent such as a coating of fluororesin.

Figure 3A:
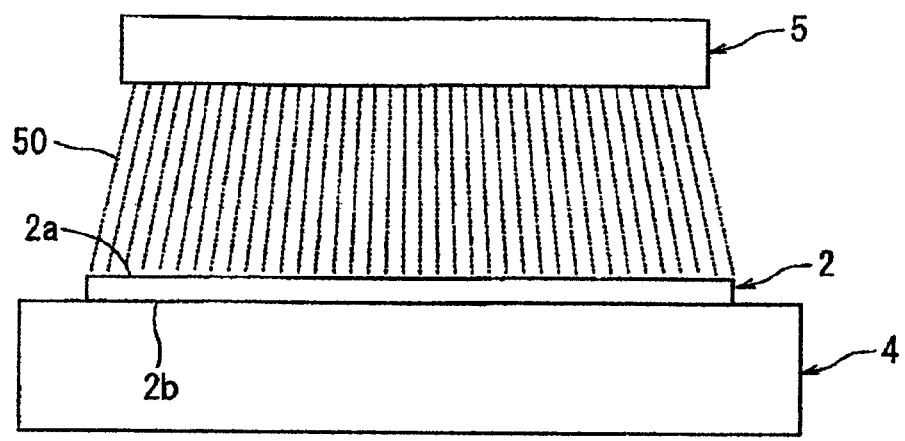
FIGS. 3A and 3B are views for illustrating a resin powder spreading step in a resin covering step.
Figure 3B:
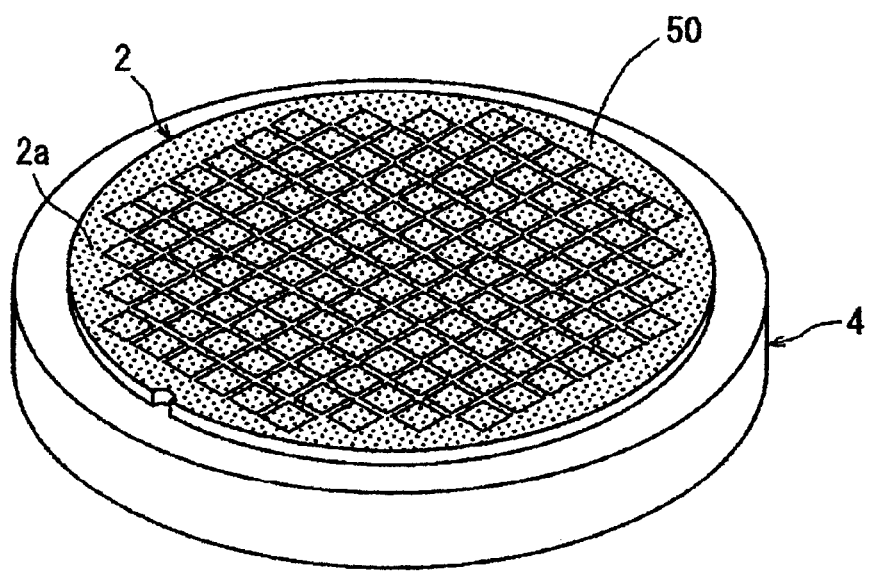

After performing the frame preparing step mentioned above, a resin covering step is performed in such a manner that a resin powder is spread on the front side 2a or back side 2b of the semiconductor wafer 2 and the partitions 31 of the frame 3 are positioned in alignment with the division lines 21 of the semiconductor wafer 2, thereby covering with the resin powder the regions on the front side 2a or back side 2b of the semiconductor wafer 2 other than the regions corresponding to the division lines 21. First, in performing this resin covering step, a resin powder for masking is spread on the front side 2a or back side 2b of the semiconductor wafer 2 (resin powder spreading step). In this preferred embodiment, the resin powder is spread on the front side 2a of the semiconductor wafer 2 as shown in FIGS. 3A and 3B. Referring to FIG. 3A, the semiconductor wafer 2 is held on a holding table 4 in the condition where the back side 2b of the semiconductor wafer 2 is attached through a peelable adhesive to the upper surface of the holding table 4.

Accordingly, the semiconductor wafer 2 is held on the holding table 4 in the condition where the front side 2a of the semiconductor wafer 2 is oriented upward. After holding the semiconductor wafer 2 on the holding table 4 as mentioned above, resin powder supplying means 5 is positioned above the semiconductor wafer 2 held on the holding table 4 and then operated as shown in FIG. 3A. As a result, a resin powder 50 is spread on the front side 2a of the semiconductor wafer 2 held on the holding table 4 as shown in FIG. 3B. The thickness of the layer of the resin powder 50 to be formed on the front side 2a of the semiconductor wafer 2 may be set to about 50 µm. The resin powder 50 may be provided by a powder of epoxy resin, which is not etched by a plasma etching gas.

Figure 4A:
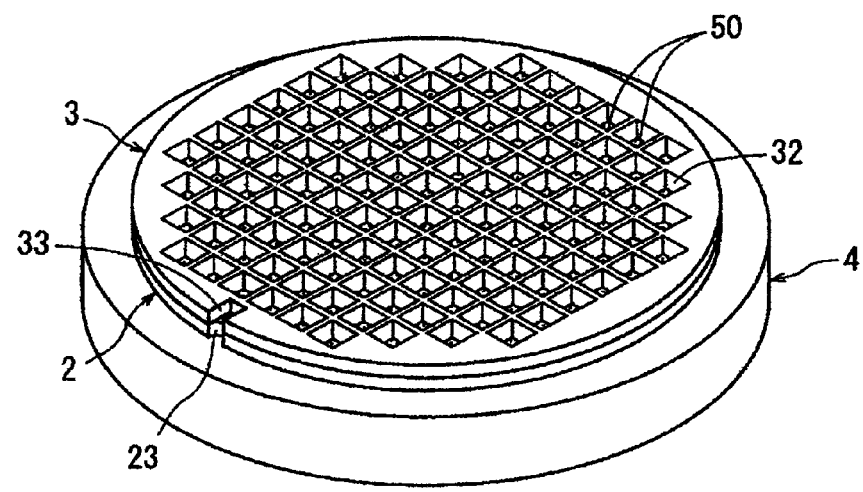
FIGS. 4A and 4B are views for illustrating a resin removing step in the resin covering step.
Figure 4B:
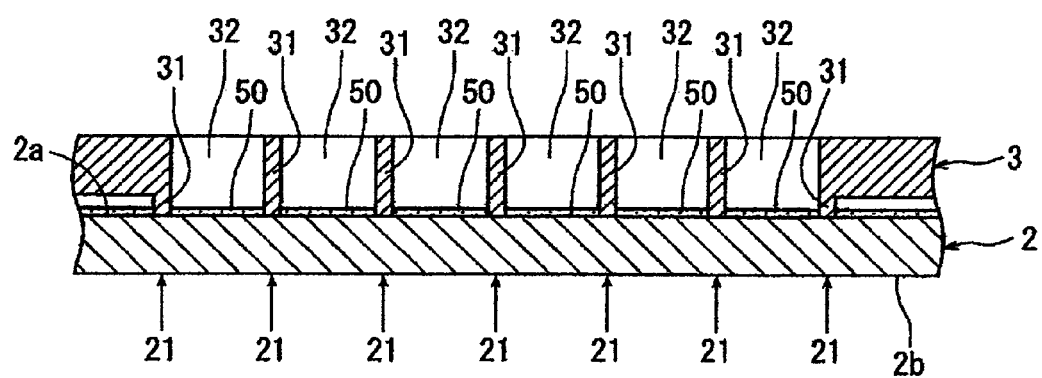

After performing the resin powder spreading step mentioned above, as shown in FIGS. 4A and 4B, the partitions 31 of the frame 3 are positioned in alignment with the division lines 21 of the semiconductor wafer 2 and then pressed against the resin powder 50 present on the division lines 21. At this time, the frame 3 is positioned so that the cutout 33 formed on the outer circumference of the frame 3 is aligned with the notch 23 formed on the outer circumference of the semiconductor wafer 2. As a result, the resin powder 50 present in the regions corresponding to the division lines 21 is removed, so that the regions on the front side 2a of the semiconductor wafer 2 other than the regions corresponding to the division lines 21 are covered with the resin powder 50 (resin removing step). In performing this resin removing step, ultrasonic vibration is preferably applied to the frame 3 to thereby remove the resin powder 50 from the regions corresponding to the division lines 21.

Figure 5A:
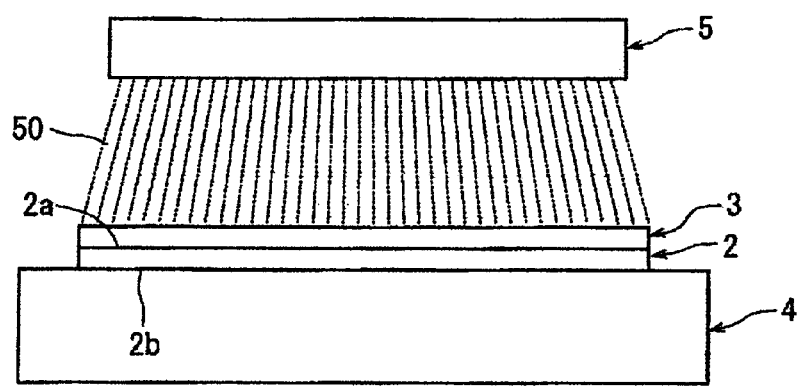
FIGS. 5A and 5B are views for illustrating another preferred embodiment of the resin covering step.
Figure 5B:
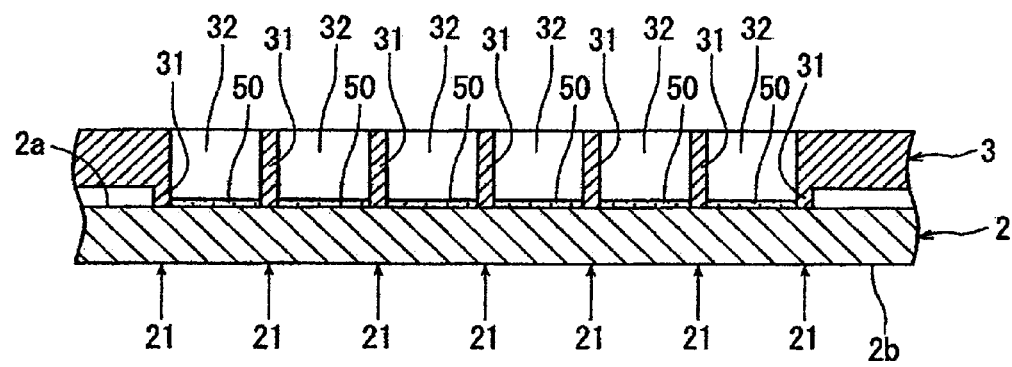

Another preferred embodiment of the resin covering step according to the present invention will now be described with reference to FIGS. 5A and 5B. As shown in FIG. 5A, the partitions 31 of the frame 3 are first positioned in alignment with the division lines 21. Thereafter, the resin powder supplying means 5 is operated to supply the resin powder 50 through the frame 3 to the front side 2a of the semiconductor wafer 2 as shown in FIG. 5A. As a result, the resin powder 50 is spread on the front side 2a of the semiconductor wafer 2 in the hollow regions 32 defined by the partitions 31 of the frame 3 as shown in FIG. 5B.

Figure 6A:
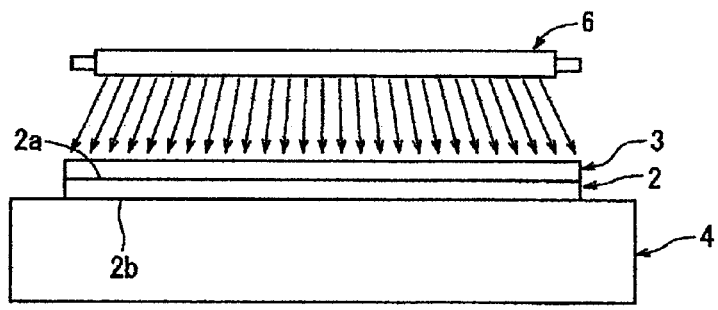
FIGS. 6A to 6D are views for illustrating a masking step.

After performing the resin covering step mentioned above, a masking step is performed in such a manner that the resin powder 50 supplied to the front side 2a or back side 2b of the semiconductor wafer 2 (the front side 2a in this preferred embodiment) is melted and cured and the frame 3 is next removed, thereby masking the regions other than the regions corresponding to the division lines 21. This masking step will now be described with reference to FIGS. 6A to 6D. In this preferred embodiment, the masking step shown in FIGS. 6A to 6D is performed to the semiconductor wafer 2 processed by the resin covering step shown in FIGS. 3A to 4B. In performing the masking step, the resin powder 50 supplied to the front side 2a or back side 2b of the semiconductor wafer 2 (the front side 2a in this preferred embodiment) is first melted and cured (resin melting and curing step). As shown in FIG. 6A, this resin melting and curing step is performed in such a manner that a heater 6 located above the semiconductor wafer 2 held on the holding table 4 is operated to heat the resin powder 50 (see FIG. 4B) in the condition where the frame 3 is kept on the semiconductor wafer 2.

Figure 6B:
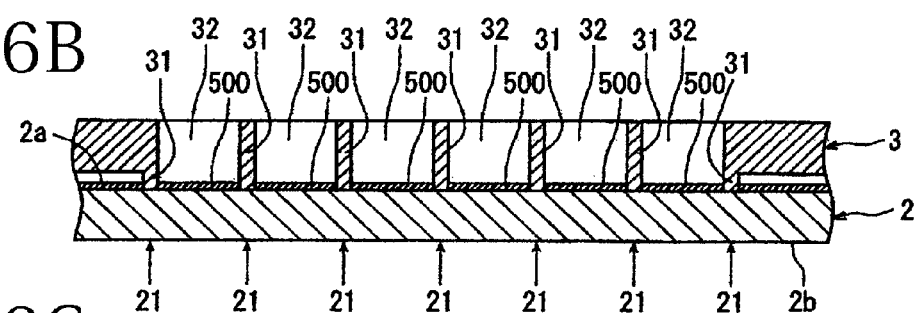
Figure 6C:
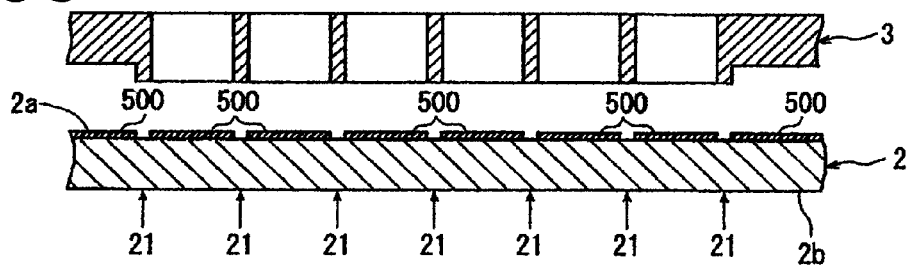
Figure 6D:
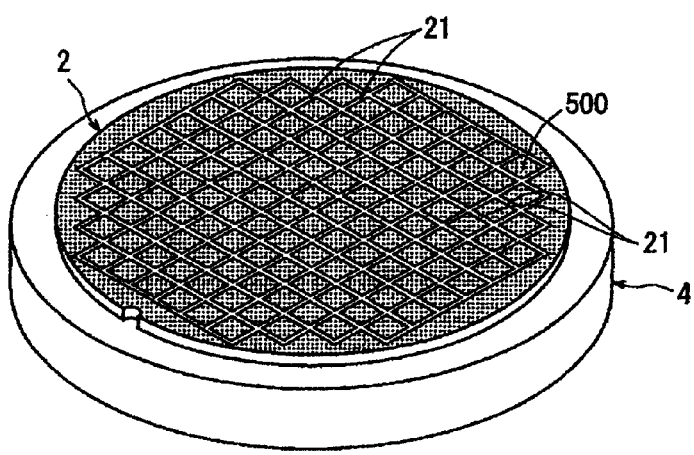

As a result, the resin powder 50 is melted and cured to form resin films 500 in the hollow regions 32 of the frame 3 as shown in FIG. 6B. After performing this resin melting and curing step, the frame 3 is removed from the semiconductor wafer 2 to form the resin films 500 on the front side 2a of the semiconductor wafer 2 in the regions other than the regions corresponding to the division lines 21 (frame removing step). As described above, the partitions 31 of the frame 3 are treated with a release agent such as a coating of fluororesin. Accordingly, there is no possibility that the resin films 500 may stick to the partitions 31 of the frame 3 in removing the frame 3, so that it is possible to prevent the generation of burrs due to sticking of the resin films 500 to the partitions 31. By performing the masking step including the resin melting and curing step and the frame removing step as mentioned above, the regions of the front side 2a of the semiconductor wafer 2 other than the regions corresponding to the division lines 21 are masked by the resin films 500 as shown in FIG. 6D.

Figure 7:
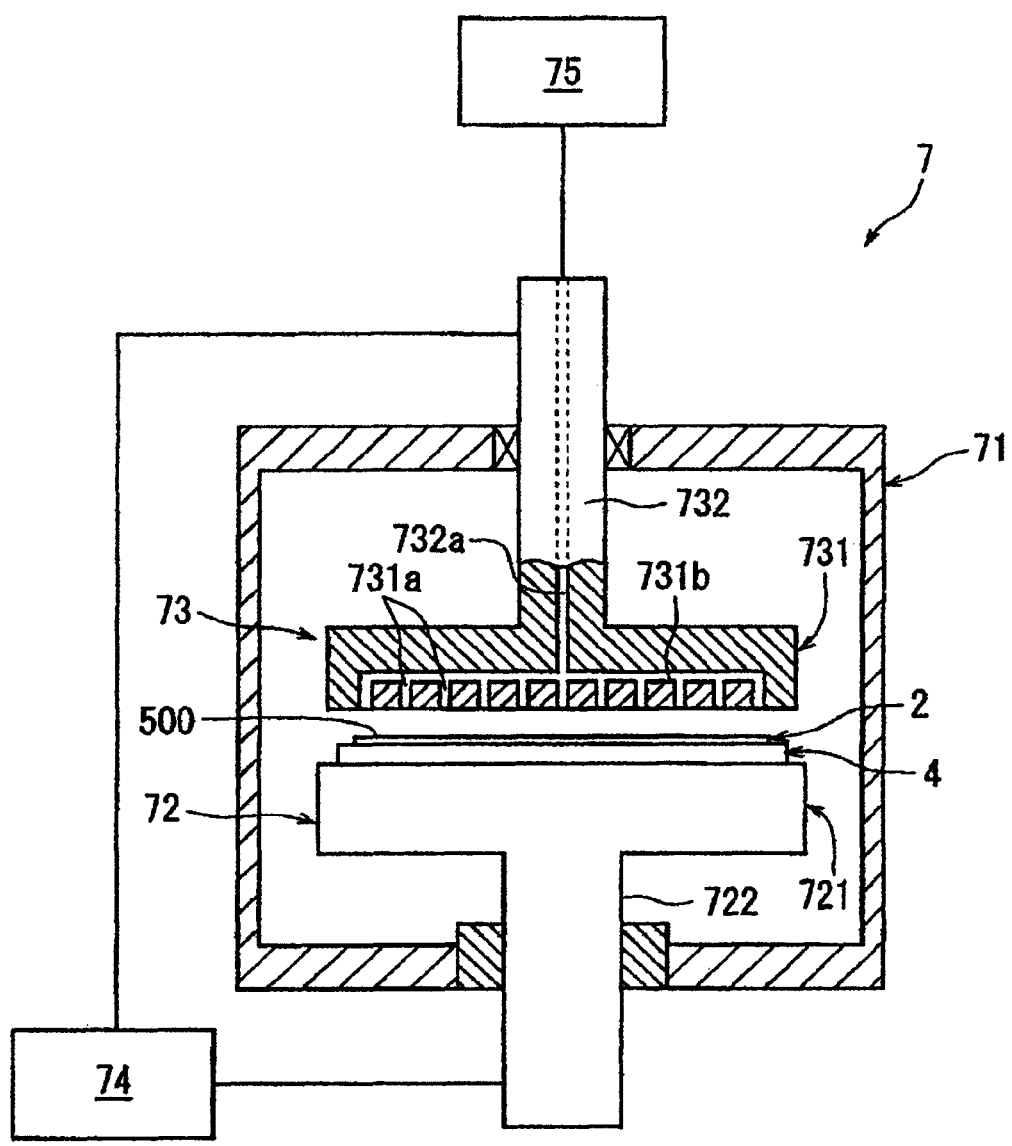
FIG. 7 is a sectional view of a plasma etching apparatus for performing an etching step.

After performing the masking step mentioned above, an etching step is performed in such a manner that the semiconductor wafer 2 is plasma-etched by using the resin films 500 as masks to thereby divide the semiconductor wafer 2 into the individual devices 22 along the division lines 21. This etching step is performed by using a plasma etching apparatus 7 shown in FIG. 7. As shown in FIG. 7, the plasma etching apparatus 7 includes a housing 71, a lower electrode 72 provided in the housing 71, and an upper electrode 73 provided in the housing 71 so as to be vertically opposed to the lower electrode 72. The lower electrode 72 includes a disk-shaped workpiece holding portion 721 and a cylindrical supporting portion 722 projecting downward from the lower surface of the workpiece holding portion 721 at a central portion thereof. The supporting portion 722 of the lower electrode 72 is connected to RF voltage applying means 74.

The upper electrode 73 includes a disk-shaped gas discharging portion 731 and a cylindrical supporting portion 732 projecting upward from the upper surface of the gas discharging portion 731 at a central portion thereof. The supporting portion 732 of the upper electrode 73 is connected to the RF voltage applying means 74. The gas discharging portion 731 of the upper electrode 73 is opposed to the workpiece holding portion 721 of the lower electrode 72. The gas discharging portion 731 of the upper electrode 73 is formed with a plurality of discharge ports 731a opening downward. These plural discharge ports 731a are in communication with gas supplying means 75 through a communication line 731b formed in the gas discharging portion 731 and a communication line 732a formed in the supporting portion 732. The gas supplying means 75 functions to supply a plasma generating gas such as sulfur hexafluoride ($SF_6$).

The plasma etching apparatus 7 mentioned above is used to perform the etching step in the following manner. First, the holding table 4 holding the semiconductor wafer 2 processed by the masking step is placed on the workpiece holding portion 721 of the lower electrode 72. Accordingly, the holding table 4 holding the semiconductor wafer 2 is placed on the workpiece holding portion 721 in the condition where the resin films 500 formed on the front side 2a of the semiconductor wafer 2 are oriented upward.

Figure 8:
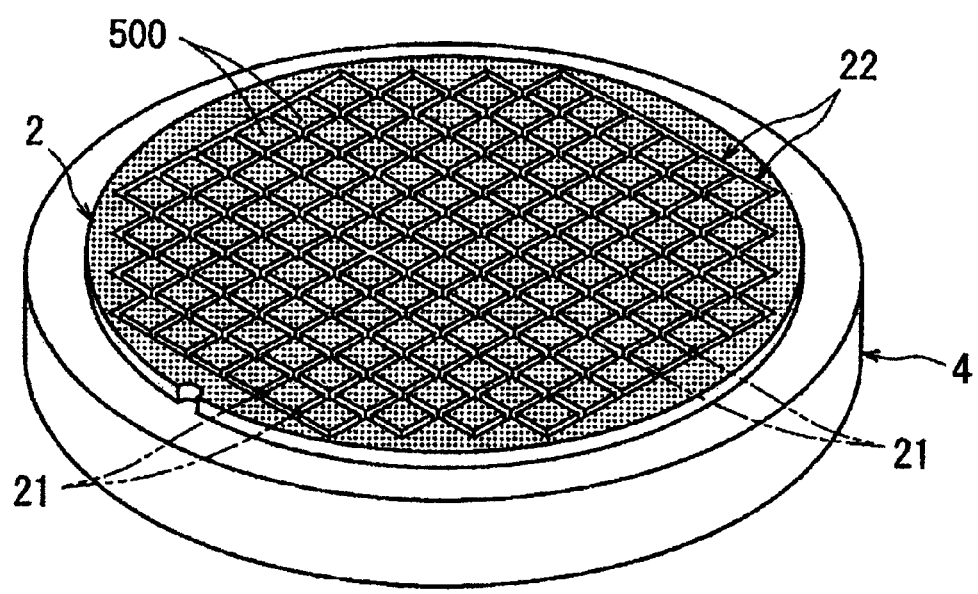
FIG. 8 is a perspective view of the semiconductor wafer processed by the etching step.

Thereafter, the gas supplying means 75 is operated to supply the plasma generating gas to the upper electrode 73. The plasma generating gas supplied from the gas supplying means 75 is fed through the communication line 732a formed in the supporting portion 732 and the communication line 731b formed in the gas discharging portion 731 to the plural discharge ports 731a. The plasma generating gas thus fed to the plural discharge ports 731a is discharged from the discharge ports 731a toward the front side 2a (upper surface) of the semiconductor wafer 2 held through the holding table 4 on the workpiece holding portion 721 of the lower electrode 72. In the condition where the plasma generating gas is supplied as mentioned above, the RF voltage applying means 74 is operated to apply an RF voltage between the lower electrode 72 and the upper electrode 73. As a result, a plasma is generated from the plasma generating gas in the space between the lower electrode 72 and the upper electrode 73, and a resultant active substance in the plasma stage acts on the front side 2a (upper surface) of the semiconductor wafer 2. Accordingly, the semiconductor wafer 2 is etched along the division lines 21 as the etching regions other than the regions masked by the resin films 500 as shown in FIG. 8. Thus, the semiconductor wafer 2 is divided along the division lines 21 to obtain the individual devices 22.

After performing the etching step mentioned above, the individual devices 22 held on the holding table 4 are transported to a pickup apparatus (not shown) for performing a pickup step as the next step.

As described above, the wafer processing method according to the present invention includes the frame preparing step of preparing the frame 3 having the plural crossing partitions 31 corresponding to the division lines 21 formed on the semiconductor wafer 2, the resin covering step of spreading the resin powder 50 on the front side 2a or back side 2b of the semiconductor wafer (the front side 2a in this preferred embodiment) and positioning the partitions 31 of the frame 3 in alignment with the division lines 21 of the semiconductor wafer 2, thereby covering with the resin powder 50 the regions on the front side 2a or back side 2b of the semiconductor wafer 2 (the front side 2a in this preferred embodiment) other than the regions corresponding to the division lines 21, the masking step of melting and curing the resin powder 50 supplied to the front side 2a or back side 2b of the semiconductor wafer 2 (the front side 2a in this preferred embodiment) and next removing the frame 3, thereby masking the resions other than the regions corresponding to the division lines 21, and the etching step of plasma-etching the semiconductor wafer 2 processed by the masking step to thereby divide the semiconductor wafer 2 into the individual devices 22 along the division lines 21. Accordingly, no exposure apparatus and no developing apparatus are required to thereby suppress an equipment cost.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer into individual devices along a plurality of crossing division lines formed on the front side of said wafer, said individual devices being formed in a plurality of separate regions defined by said division lines, said wafer processing method comprising:
    a frame preparing step of preparing a frame having a plurality of crossing partitions corresponding to said division lines of said wafer;
    a resin covering step of spreading a resin powder on the front side or back side of said wafer and positioning said partitions of said frame in alignment with said division lines of said wafer, thereby covering with said resin powder the regions on the front side or back side of said wafer other than the regions corresponding to said division lines;
    a masking step of melting and curing said resin powder supplied to the front side or back side of said wafer processed by said resin covering step and next removing said frame, thereby masking the regions other than the regions corresponding to said division lines; and
    an etching step of plasma-etching said wafer processed by said masking step to thereby divide said wafer into said individual devices along said division lines.

2. The wafer processing method according to claim 1, wherein said resin covering step includes the step of applying ultrasonic vibration to said frame in the condition where said partitions of said frame are positioned in alignment with said division lines, thereby removing said resin powder from the regions corresponding to said division lines.

3. The wafer processing method according to claim 1, wherein said resin covering step includes the step of spreading said resin powder in the condition where said partitions of said frame are positioned in alignment with said division lines.

\* \* \* \* \*